United States Patent [19]

Lischke et al.

[11] Patent Number: 4,587,481
[45] Date of Patent: May 6, 1986

[54] ARRANGEMENT FOR TESTING MICRO INTERCONNECTIONS AND A METHOD FOR OPERATING THE SAME

[75] Inventors: Burkhard Lischke, Munich; Jürgen Frosien, Ottobrunn; Reinhold Schmitt, Munich, all of Fed. Rep. of Germany

[73] Assignee: Siemens Aktiengesellschaft, Berlin & Munich, Fed. Rep. of Germany

[21] Appl. No.: 504,742

[22] Filed: Jun. 16, 1983

[30] Foreign Application Priority Data

Sep. 22, 1982 [DE] Fed. Rep. of Germany ....... 3235119

[51] Int. Cl.⁴ .......................................... G01R 15/12
[52] U.S. Cl. .................. 324/73 PC; 324/51
[58] Field of Search .............. 324/51, 73 AT, 73 PC; 371/20

[56] References Cited

U.S. PATENT DOCUMENTS

| | | | |
|---|---|---|---|
| 3,590,369 | 6/1971 | Wainwright | 324/51 |
| 3,679,970 | 8/1972 | Winters et al. | 324/51 |
| 3,713,019 | 1/1973 | Van Bosse | 324/51 |
| 3,746,973 | 8/1973 | McMahon, Jr. | 324/51 |
| 3,803,483 | 4/1974 | McMahon, Jr. | 324/51 |
| 3,806,800 | 4/1974 | Bove et al. | 324/51 |
| 3,825,824 | 8/1974 | Herron et al. | 324/51 |
| 3,830,956 | 8/1974 | Wootton et al. | 324/51 X |
| 3,851,161 | 11/1974 | Sloop | 324/73 PC X |
| 4,114,093 | 9/1978 | Long | 371/20 X |
| 4,471,298 | 9/1984 | Frohlich | 324/73 PC |

FOREIGN PATENT DOCUMENTS 2029032 3/1980 United Kingdom .......... 324/73 AT

OTHER PUBLICATIONS

P. H. Smith, Automatic Testing of Leakage Current Monitor for Bipolar Integrated Circuit, IBM Technical Disclosure Bulletin, Nov. 1975, pp. 1935, 1936.

Primary Examiner—Stanley T. Krawczewicz
Attorney, Agent, or Firm—Hill, Van Santen, Steadman & Simpson

[57] ABSTRACT

An arrangement for electrically testing microinterconnections with electric test contacts may be used given drastically-reduced dimensions of electric conductors and of the grid dimensions in printed circuitboards. The electric test contacts are selectable by way of internal switches. The test contacts can be disposed in a matrix whose grid dimension corresponds to the grid dimension of a printed circuitboard to be tested.

12 Claims, 7 Drawing Figures

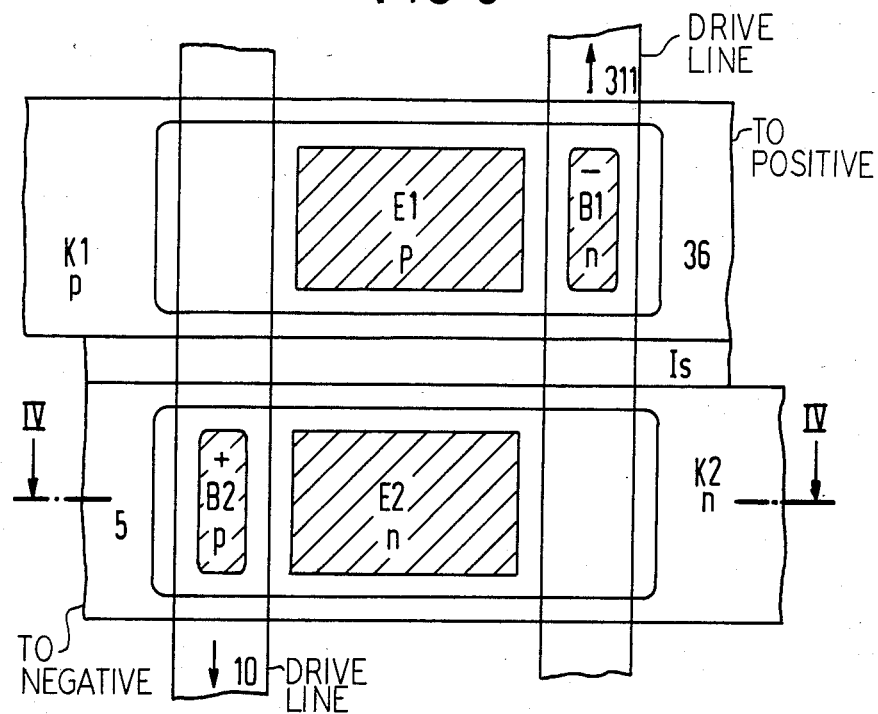
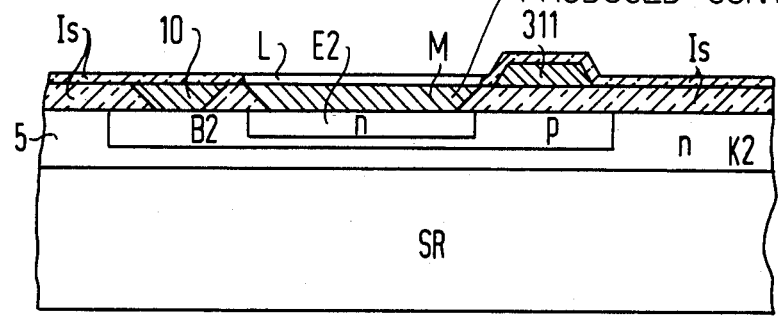

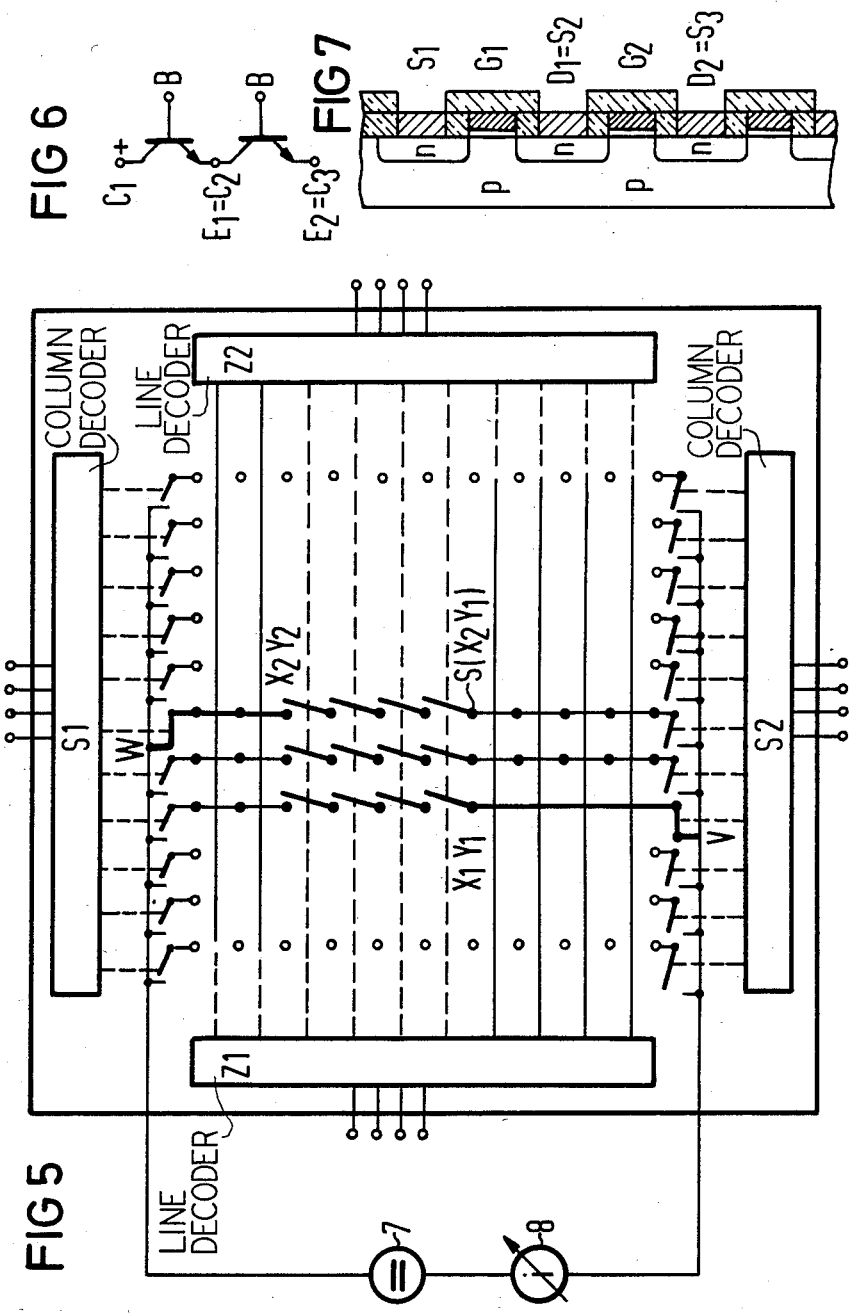

4,587,481

ARRANGEMENT FOR TESTING MICRO INTERCONNECTIONS AND A METHOD FOR OPERATING THE SAME

BACKGROUND OF THE INVENTION

1. Field of the Invention

The present invention relates to an arrangement for electrically testing microinterconnections with electric test contacts, and more particularly to such an arrangement in which the test contacts are selectable, and to a method for operating such an arrangement.

Arrangements are proposed for the electric testing of printed circuitboards and microinterconnections which are also usable when the dimensions of electrical conductors and of grid dimensions in printed circuitboards are further drastically reduced.

2. Description of the Prior Art

Up to now, needle adapters were put in place on the electric conductors to be measured for the purpose of providing an electrical test of printed circuitboards and microinterconnections. Given the use of grid dimensions below 200 μm for printed circuitboards, however, the emplacement of needle adapters on the electric conductors to be measured for the purpose of the electrical test of microinterconnections becomes difficult because mechanical contacts of a standard type are very difficult to realize with such small dimensions. The number of outages also increases with the plurality of contacts.

SUMMARY OF THE INVENTION

The object of the present invention is to provide an arrangement of the type generally set forth above for electrically testing printed circuitboards and microinterconnections, which arrangement can also be employed given drastically-reduced dimensions of electrical conductors and of grid dimensions in printed circuitboards.

The above object is achieved, according to the invention, by the provision of an arrangement of the general type set forth above which is characterized in that the electrical test contacts are selectable over internal switches.

According to the invention, very fine, electrically-conductive contacts are manufactured with the same techniques as are known to those skilled in the art from planar technology of silicon and photolithography. The problem of conducting lines to the test contacts of an arrangement constructed in accordance with the invention is resolved in that the test contacts are selectable by internal switches so that a multitude of test contacts can be supplied over one and the same test voltage source. A direct contact of the test contacts of an arrangement constructed in accordance with the invention with the electrical paths of a microinterconnection is fundamentally possible. When, however, the test contacts must be protected against mechanical damage to a particular degree, then a soft contact over an electrically-conductive liquid, for example, by way of an electrolyte, is employed between a test contact and a track to be electrically tested.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 3 is a schematic illustration of a node of a switching matrix according to FIG. 2;

FIG. 4 is a fragmentary sectional view taken through an npn transistor according to FIG. 3 along the parting line IV—IV;

FIG. 5 is a schematic representation of an arrangement for testing microinterconnections with the assistance of a switching matrix; and FIGS. 6 and 7 schematically illustrate possible realizations of the switches of the switching matrix of FIG. 5.

DESCRIPTION OF THE PREFERRED EMBODIMENTS

Figure 1:
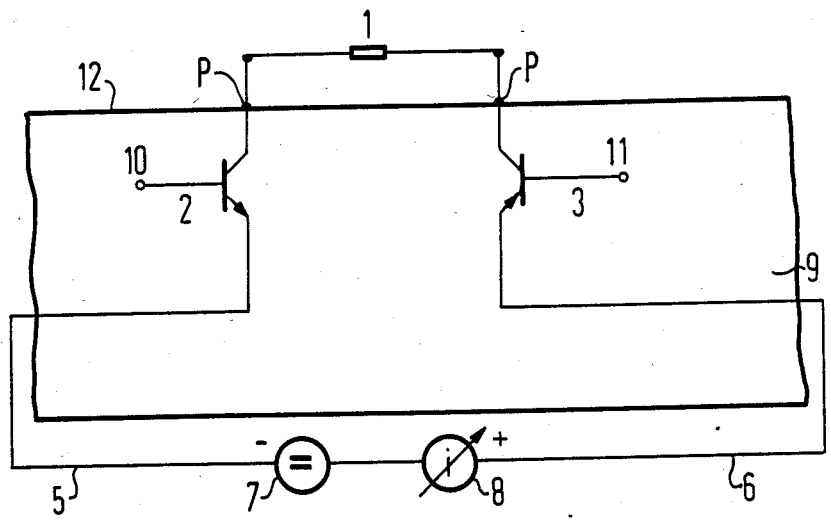
FIGS. 1 and 2 schematically illustrate a switching matrix constructed in accordance with the present invention for testing microinterconnections.
Figure 2:
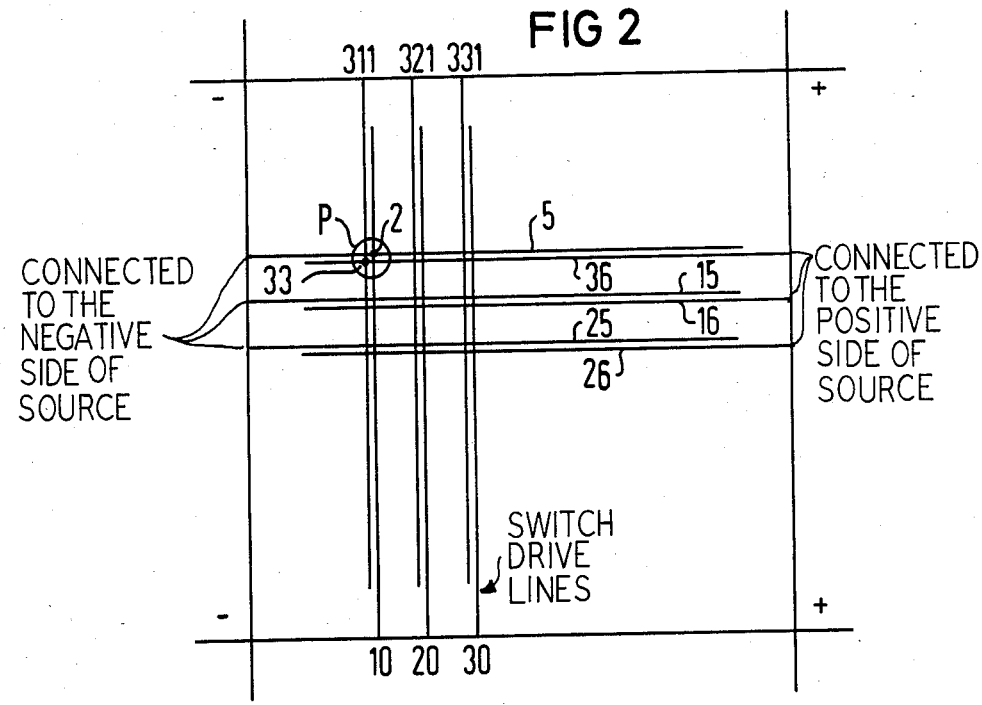

Referring to FIGS. 1 and 2, an exemplary embodiment of the invention is illustrated. In order to measure the resistance 1 of a conductor, it suffices to apply a known voltage between the n points of the resistor 1 with the assistance of a d.c. voltage source 7 and to measure the current with the assistance of a current measuring device 8.

As schematically illustrated, the test contacts P of an arrangement constructed in accordance with the invention for electrically testing microinterconnections are disposed, for this purpose, in a matrix whose grid dimension corresponds to the grid dimension of the printed circuitboard to be tested. The lines 5, 6, 15, 16, 25, 26, 35, 36 for the test voltages are embedded in a substrate 9 of the arrangement for electrically testing microinterconnections and are through-connected to the desired point P by way of switches 2, 3, 33 at the surface 12 of the arrangement.

When the switch 2, 3, 33 is independent of the current direction, then one switch suffices which either through-connects the positive or, respectively, the negative test voltage, on the one hand, or is open, on the other hand. In the latter case, given an open switch, the corresponding contact P does not participate in the measurement.

In the exemplary embodiment of the invention schematically illustrated in FIG. 2, two respective switches 2, 33 (an npn transistor and a pnp transistor, for example) are provided per test point P. With the assistance of such a pair of switches per test point, the test voltages can be respectively through-connected to the respective test contacts P such that each test point P can be measured relative to every other test point P. The switches or, respectively, transistors 2, 3, 33, etc, are switched or driven by way of the contacts 10, 11 in FIG. 1 or, 10, 20, 30, 311, 321, 331 in FIG. 2. The lines 5, 15, 25 are lines having a negative test voltage applied thereto, while the lines 6, 16, 26 and 36 are lines having a positive test voltage applied thereto.

FIG. 3 is a schematic illustration of a node of a switching matrix according to FIG. 2. This node belongs to a single test contact P. Leading to this node according to FIG. 3 are, for example, a line 5 having a negative test potential and a line 36 having a positive test potential. The node according to FIG. 3 comprises a pnp transistor 33 and an npn transistor 2. The base B1 of the pnp transistor 33 is driven over a line 311. The base B2 of the npn transistor 2 is driven over a line 10. The pnp transistor 33 also comprises a collector K1 and an emitter E1. The collector K1 in the area of the node of the switching matrix is identical to the line 36. The transistor 33 is through-connected in that the base B1 is driven with a corresponding, negative voltage.

The npn transistor in FIG. 3 corresponds to the transistor 2 of FIGS. 1 and 2 and comprises a base B2, an emitter E2 and a collector K2. In the area of the node according to FIG. 3, the collector K2 is identical with the current conductor 5. The transistor 2 is through-connected given drive of the base B2 with the corresponding positive voltage.

FIG. 4 illustrates a sectional view through the npn transistor of FIG. 3. According to FIG. 4, an arrangement constructed in accordance with the present invention for electrically testing microcircuits comprises a substrate SR consisting of pure silicon. An n-semiconductor for the collector K2 and for the current conductor 5 is directly applied to the substrate SR in the area of the node according to FIG. 3. A p-semiconductor for the base B2 is embedded thereabove. An n-semiconductor for the emitter E2 is in turn embedded therein. The control line 10 is disposed at one side above the base B2. An insulator Is is located at the other side of the base B2 and the control line 311 for the base B1 of the pnp transistor is located thereabove, the control line 311 forming a node according to FIG. 3 together with the npn transistor. The control lines 10 and 11 are insulated from air by the insulating material Is. Given the example according to FIG. 4, a metallic contact M is applied to the emitter E2, the contact M, together with a metallic contact applied to the emitter E1 of the pnp transistor, precisely defining a test contact P of the arrangement for electrically testing microcircuits. Somewhat less area is thereby available for the test contact P then is prescribed by the grid dimension of an arrangement according to FIG. 2. An arrangement according to FIG. 4, having two depressed, metallic contacts M above the emitter E1 and above the emitter E2 enables a soft contact at the test contact P over a conductive liquid L, for example, over an electrolyte. The contacts of a microinterconnection to be tested are thereby protected against mechanical damage in a particular manner. For direct mechanical contact at the test contact P, the metallic contact illustrated in FIG. 4 would have to be slightly elevated.

FIG. 5 illustrates an arrangement for testing microcircuits with the assistance of a switching matrix. Each test point having the coordinates $X_n$, $Y_m$ exhibits one pair $S(X_nY_m)$ of switches in this example. The test points $X_1Y_1$ and $X_2Y_2$ are supplied with voltage in that all equivalent switches of the switch pairs $S(X_nY_m)$ are closed by line decoders $Z_1$, $Z_2$ up to $Y_1$ or, respectively, $Y_2$ in accordance with the voltages to be tested. A pair of column decoders $S_1$, $S_2$ then select the columns $X_1$ and $X_2$. By closing the corresponding switches V, W on the basis of the column decoders $S_1$, $S_2$, the test voltage of the d.c. voltage source 7 is applied to the selected test contacts $X_1$, $Y_1$, $X_2$, $Y_2$.

FIG. 6 illustrates a possible realization of the switches $S(X_nY_m)$ using bipolar transistors. Equivalent npn transistors are connected in series in FIG. 6, whereby the emitter $E_i$ is respectively connected to the collector $C_{i+1}$ of the following transistor. The transistors of FIG. 6 are controlled by the line decoders $Z_1$, $Z_2$ over the respective base contacts B.

FIG. 7 illustrates a realization of the switches $S(X_nY_m)$ of FIG. 5 using metal-oxide-semiconductor (MOS) transistors. In this example, npn transistors are again connected in series, whereby the drain electrode $D_i$ of one transistor respectively coincides with the source electrode $S_{i+1}$ of the following transistor. The line decoders $Z_1$, $Z_2$ control these transistors by way of the gate electrodes $G_i$.

For the test of microinterconnections, a test plate constructed in accordance with the invention must basically be aligned relative to the unit under test before the beginning of the test. Illustrations of specific transistors or layouts in the figures do not restrict the application of the invention to the illustrated exemplary embodiments. The switches disposed in a switching matrix can also be realized in some other manner.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. An arrangement for electrically testing microinterconnections having a predetermined geometric arrangement, comprising:

a test member including a surface and a planar contact structure comprising a plurality of test contacts carried at said surface for electrically contacting respective points of the microinterconnections, said test contacts arranged in said predetermined geometrical arrangement;

a plurality of selectively operable switch means embedded in said member and each connected to a respective test contact, selective operation of a pair of said switch means defining an electrical path to be tested;

conductors embedded in said member for carrying test voltages for said test contacts and connected to said plurality of switches; and a series circuit including a d.c. voltage source and a current measuring device connected in series with said plurality of switch means to provide and measure current flow through a selectively defined current path.

2. The arrangement of claim 1, wherein:
   said test contacts comprise a photolithographically produced structure.

3. The arrangement of claim 1, and further comprising:
   a conductive liquid covering said test contacts to provide a soft contacting with and protection of mechanical damage of points of the microinterconnection.

4. The arrangement of claim 1, wherein:
   said plurality of switch means comprises first switches connected to one polarity of the voltage source and second switches connected to the other polarity of the voltage source.

5. The arrangement of claim 1, wherein:
   said test contacts are disposed in a matrix with each test contact having a respective switch means adjacent thereto.

6. An arrangement for electrically testing a plurality of paths between spaced test points of microinterconnections of a predetermined geometric arrangement, comprising:
   a test member including a surface;

a planar contact structure comprising a plurality of test contacts carried at said surface of said test member and spaced in accordance with the spacing of said predetermined geometrical arrangement of said test points;

switch means including a plurality of selectively operable switches embedded in said test member adjacent and connected to respective test contacts for selecting the paths for testing;

a plurality of conductors embedded in said test member and connected to said switch means for carrying test voltages; and supply means connected to said plurality of conductors to be selectively connected to said paths, including current detecting means for determining current flow through a selected path.

7. The arrangement of claim 6, wherein:

each of said switches comprises at least one transistor including a controlled current path connected to respective ones of said conductors, and a control input; and said switch means comprises a plurality of drive lines connected to said control inputs.

8. The arrangement of claim 7, and further comprising:

a plurality of possible series circuits through said switch means;

first decoder means connected to said drive lines and operable to construct a specified series circuit of selected switches out of a plurality of the possible series circuits to define a test path;

a plurality of further switches connected between said plurality of conductors and said plurality of possible series circuits; and second decoder means connected to said further switches and to said supply means and operable to connect said supply means to said selected specified series circuit.

9. The arrangement of claim 6, wherein:

each of said switches comprises two transistors of opposite current carrying direction connected to respective conductors and drive lines.

10. The arrangement of claim 9, wherein:

each of said transistors, drive lines and conductors are carried integrated on a common base.

11. The arrangement of claim 10, wherein: said base comprises silicon.

12. A method of operating an arrangement for electrically testing a plurality of paths between spaced test points, arranged in a matrix of orthogonal directions, of a microinterconnection, the arrangement comprising a test member including a surface, a plurality of test contacts at the surface spaced in a matrix and in accordance with the spacing of the test points, supply means including first and second terminals and a voltage source and a current detector connected between the first and second terminals, a pair of test current conductors embedded in the test member and connected, respectively, to the first and second terminals, a plurality of first switches arranged in the matrix adjacent and connected to the test contacts and selectively operable to define a plurality of possible series circuits in one orthogonal direction each including a test path and each extending between the test current conductors, and a plurality of selectively operable second switches embedded in the test member adjacent the ends of the series circuits and the test current conductors, said method comprising the steps of:

applying the test member to the microinterconnection to engage the test contacts in the same plane and the test points;

selectively operating the first switches to define a series circuit including a test path; and selectively operating the second switches at the ends of the defined series circuit to apply voltage thereto and detect the current flow therethrough.

* * * * *